United States Patent
Chumbes et al.

(10) Patent No.: US 9,293,379 B2
(45) Date of Patent: Mar. 22, 2016

(54) SEMICONDUCTOR STRUCTURE WITH LAYERS HAVING DIFFERENT HYDROGEN CONTENTS

(75) Inventors: Eduardo M. Chumbes, Andover, MA (US); William E. Hoke, Wayland, MA (US); Kelly P. Ip, Lowell, MA (US); Dale M. Shaw, Groton, MA (US); Steven K. Brierley, Westford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/553,249

(22) Filed: Sep. 3, 2009

(65) Prior Publication Data

US 2011/0049581 A1 Mar. 3, 2011

(51) Int. Cl.
*H01L 29/66* (2006.01)
*H01L 21/8252* (2006.01)
*H01L 21/311* (2006.01)
*H01L 27/06* (2006.01)

(52) U.S. Cl.
CPC ...... *H01L 21/8252* (2013.01); *H01L 21/31111* (2013.01); *H01L 27/0605* (2013.01)

(58) Field of Classification Search
CPC .................................................. H01L 27/0605
USPC ......................................... 257/277, E21.008
See application file for complete search history.

(56) References Cited

U.S. PATENT DOCUMENTS

| 4,933,206 | A * | 6/1990 | Cox | 427/558 |
|---|---|---|---|---|
| 6,222,257 | B1 | 4/2001 | Cathey et al. | |
| 6,229,156 | B1 | 5/2001 | Murai et al. | |
| 2001/0012652 | A1 | 8/2001 | Matsuda | |
| 2002/0130389 | A1 | 9/2002 | Arimochi et al. | |
| 2008/0280400 | A1 | 11/2008 | Aihara | |

FOREIGN PATENT DOCUMENTS

| EP | 0 742 584 A2 | 11/1996 |
|---|---|---|
| EP | 0 742 584 A3 | 10/1997 |
| JP | 07221271 | 8/1995 |
| JP | 10261616 | 9/1998 |

OTHER PUBLICATIONS

Notification of Transmittal of the International Search Report and the Written Opinion of the International Searching Authority, or the Declaration, PCT/US2010/046283, date of mailing Nov. 12, 2010, 5 pages.
Written Opinion of the International Searching Authority, PCT/US2010/046283, date of mailing Nov. 12, 2010, 10 pages.
Palacios et al., "AlGaN/GaN High Electron Mobility Transistors With InGaN Back-Barriers", IEEE Electron Device Letters, vol. 27, No. 1, Jan. 2006, pp. 13-15.

(Continued)

*Primary Examiner* — Hsin-Yi Hsieh
(74) *Attorney, Agent, or Firm* — Daly, Crowley, Mofford & Durkee, LLP

(57) ABSTRACT

A method for forming a structure on a surface of a semiconductor. The method includes: forming the material as a lower layer of the structure using a first deposition process to provide the lower layer with a first etch rate to a predetermined etchant; forming the upper layer of the structure with the material on the lower using a second deposition process to provide the upper layer with a second etch rate to the predetermined etchant higher than the first etch rate; and applying the predetermined etchant to upper layer to selectively remove the upper while leaving the lower layer.

8 Claims, 4 Drawing Sheets

(56) References Cited

OTHER PUBLICATIONS

Notification Concerning Transmittal of International Preliminary Report on Patentability (Chapter I of the Patent Cooperation Treaty) dated Mar. 15, 2012, PCT/US2010/046283, 1 page.

International Preliminary Report on Patentability dated Mar. 6, 2012, PCT/US2010/046283, 1 page.

Written Opinion of the International Searching Authority, PCT/US2010/046283, 9 pages.

* cited by examiner

SEMICONDUCTOR STRUCTURE WITH LAYERS HAVING DIFFERENT HYDROGEN CONTENTS

TECHNICAL FIELD

This disclosure relates generally to semiconductor structures and methods.

BACKGROUND AND SUMMARY

As is known in the art, many present Microwave (Millimeter-wave) Monolithic Integrated Circuit (MMIC) fabrication processes require two deposited layers of Plasma Enhanced Chemical Vapor Deposition (PECVD) silicon nitride (SiN): (1) thin (<100-nm) layer for surface passivation (Pass-SiN) of the transistors; and (2) a thick (>200-nm) layer for robust Metal-Insulator-Metal (MIM) capacitors (Cap-SiN). These two layers are over the active region between the source and drain contacts of the transistors. In this scenario, the latter layer or film is not essential on the transistor yet it adds unwanted parasitic capacitances between the metal contacts in the active region (e.g. source-gate, gate-drain, and source-drain) that deleteriously load the radio frequency (rf) gain performance of the device. This becomes a significant problem for millimeter-wave devices where gain becomes the limiting component to its overall performance.

This RF loading by the Cap-SiN is best exemplified on gallium nitride (GaN) based high electron mobility transistors (HEMTs), where the gain (GMAX) across frequency may be lowered by up to 2.0-2.5 dB when the 200-nm Cap-SiN is added. Since the function of this film does not bring any benefit to the HEMT, the finished device inherently incurs this 2-3 dB gain reduction. Therefore, there is a need to decouple the Cap-SiN from the Pass-SiN in the transistor.

Pass-SiN films and similar ones from other groups has proven over the years to be an essential feature of the device because of its ability to dramatically reduce rf dispersion effects to tolerant levels that otherwise would be significantly deleterious to overall device power performance.

The common method to realize Pass- and Cap-SiN for MMICs is by deposition at approximately 300 C with PECVD. For the latter film, this elevated temperature process eliminates the ability for selective area deposition with standard photolithography processes. Thus this film must be blanket-coated over the whole wafer and then selectively patterned to form MIM capacitors. However, because the deposition conditions for both SiN films are the same, selectively removing upper portions of the Cap-SiN layer in a reproducible manner down to the Pass-SiN to thin the dielectric for the transistor relative to the thickness desired for the capacitor SiN layer is extremely difficult and impractical on a production level.

Another issue is that the PECVD Pass-SiN layer is deposited on the semiconductor after the semiconductor has been removed from the growth apparatus causing significant surface contamination from air exposure. High concentrations of contaminants such as carbon, oxygen, and silicon are now present on the air-exposed surface, which are very difficult to remove prior to PECVD deposition. Residual contaminants, which become buried at the semiconductor/Pass-SiN interface, are in the high electric field region between the gate and drain electrodes of the transistor, which can lead to deleterious transistor leakage currents.

SUMMARY

In accordance with the present disclosure, a method is provided for forming a structure on a surface of a semiconductor. The method includes: forming the material as a lower layer of the structure using a first deposition process to provide the lower layer with a first etch rate to a predetermined etchant; forming the upper layer of the structure with the material on the lower using a second deposition process to provide the upper layer with a second etch rate to the predetermined etchant higher than the first etch rate; and applying the predetermined etchant to upper layer to selectively remove the upper while leaving the lower layer.

In one embodiment, a method is provided for forming a pair of structures of a material having different thicknesses on a pair of different regions of a surface of a semiconductor. The method includes: forming the material as a lower layer with a first thickness extending over the pair of different regions using a first deposition process, such lower layer being formed with the first deposition process to provide the lower layer with a first etch rate to a predetermined etchant; forming the upper layer with the material on the lower layer over the pair of different regions with a second thickness different from the first thickness using a second deposition process to provide the second layer with a second etch rate higher than the first etch rate; masking a first portion of the upper layer over a first one of the pair of different regions while exposing a second portion of the upper layer over a second one of the pair of different regions; and applying the predetermined etchant to the exposed second portion of the upper layer to selectively remove the upper layer over the second one of the pair of different regions to form one of the structures while leaving the lower layer over the second one of the pair of different regions and leaving the upper layer on the lower layer over the first one of the pair of regions to provide another one of the structures.

In one embodiment, a method is provided for forming a semiconductor device and a capacitor over different laterally spaced surface regions of a semiconductor, comprising: forming a dielectric material as a lower dielectric layer extending over the different laterally spaced regions using a first deposition process, such lower dielectric layer being formed with the first deposition process to provide the lower dielectric layer with a first etch rate to a predetermined etchant; forming the device in a first one of the regions with portions of the lower dielectric layer being disposed between a gate contact and a drain contact of the device and between the gate contact and a source contact of the device; removing portions of the lower dielectric layer over a second region to expose a capacitor region; forming the lower electrode of the capacitor on the capacitor region; forming the dielectric material as a continuous upper dielectric layer extending on the lower electrode of the capacitor and on the lower dielectric layer disposed between the gate contact and the drain contact and between the gate contact and the source contact, the upper dielectric layer being formed thicker than the lower dielectric layer using a second deposition process to provide the second dielectric layer with a second etch rate to the predetermined etchant being higher than the first etch rate; masking a portion of the upper dielectric layer on the lower electrode of the capacitor while exposing a portion of the upper dielectric layer on the lower dielectric layer over the gate contact and between the gate contact and the drain contact and between the gate contact and the source contact; applying the predetermined etchant to the exposed portion of the upper dielectric layer on the lower dielectric layer over the gate contact and between the gate contact and the drain contact and between the gate contact and the source contact to selectively remove the upper dielectric layer on the lower dielectric layer over the gate contact and between the gate contact and the drain contact and between the gate contact and the source contact while leaving unetched the masked portion of the upper dielectric layer on the lower electrode of the capacitor, and forming an upper electrode for the capacitors on the unetched portion of the upper dielectric layer on the lower electrode of the capacitor.

In one embodiment, the upper dielectric layer is formed thicker than the lower dielectric layer using a second deposition process different from the first deposition process In one embodiment, the first deposition process is molecular beam epitaxial (MBE) growth and the second deposition process is non-MBE growth, for example Metal Organic Chemical Vapor Deposition (MOCVD), Atomic Layer Deposition (ALD) or PECVD.

In one embodiment, the second deposition process is performed in a hydrogen environment wherein the hydrogen content of the environment is at least an order of magnitude greater than the hydrogen content of the environment used in the first deposition process.

In accordance with the disclosure, a structure on a surface of a semiconductor includes a lower layer having a different hydrogen content than an upper layer of the structure.

In one embodiment, the lower layer and the upper layer are the same material.

In one embodiment, the material is a dielectric material.

In accordance with the disclosure, a structure includes: a first layer; and a second layer having a different hydrogen content than the first layer.

In one embodiment, the first layer and the second layer are the same material.

In one embodiment, the material is a dielectric material.

In one embodiment, a structure is provided having: a semiconductor; a capacitor disposed on one surface portion of the semiconductor and a transistor device disposed on a second surface portion of the semiconductor; wherein the capacitor includes a capacitor dielectric; wherein electrodes of the transistor device are separated by a device dielectric; wherein the capacitor dielectric and the device dielectric are the same material and have different thicknesses; and wherein one of the dielectrics has a different hydrogen content than the other dielectric.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
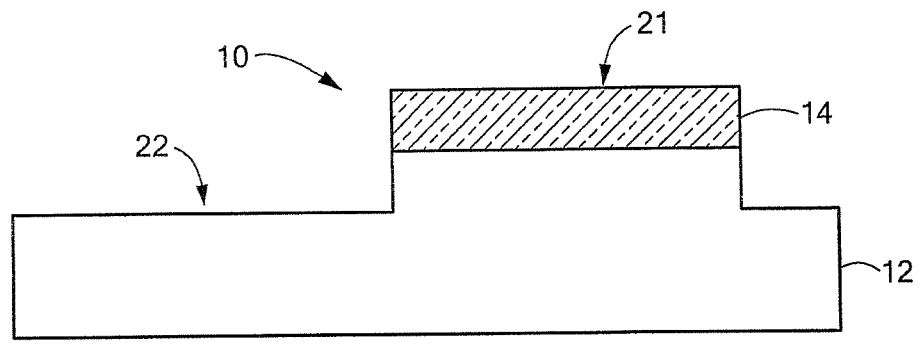
FIGS. 1-8 are cross sectional diagrammatical sketches of a semiconductor structure having a transistor device and a capacitor formed in different regions of the structure at various steps in the fabrication thereof in accordance with the disclosure.

Referring now to FIG. 1, a wafer 10, here gallium nitride (GaN) for example, has a layer of semiconductor material 12, here GaN, for example, epitaxially formed in situ on the wafer 10 using molecular beam epitaxy (MBE) or metal-organic chemical vapor deposition (MOCVD). Next, in an MBE embodiment, with the wafer 10 remaining in the MBE apparatus, not shown, the GaN layer 12, is coated in situ with a dielectric layer 14, here silicon nitride (SiN) to provide a passivation layer using the MBE apparatus. In an MOCVD/MBE embodiment, the substrate is coated with GaN and is then removed from the MOCVD (not shown) equipment and placed in the MBE apparatus, not shown, the GaN layer 12, is coated ex situ with a dielectric layer 14, here silicon nitride (SiN) to provide a passivation layer using the MBE apparatus. The passivation dielectric layer is formed in the MBE apparatus in an environment with little, e.g. much less than one percent, hydrogen at a growth temperature of 500-700° C. Next, the structure is removed from the MBE apparatus and etched to form a mesa structure as shown in FIG. 1. This etch also creates a mesa-like structure for a transistor device region 21 and an adjacent capacitor region 22 where the dielectric layer 14 is removed.

Figure 2:
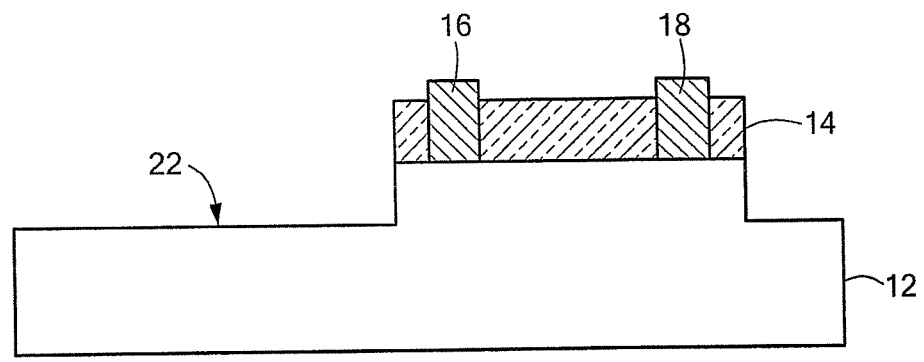
Figure 3:
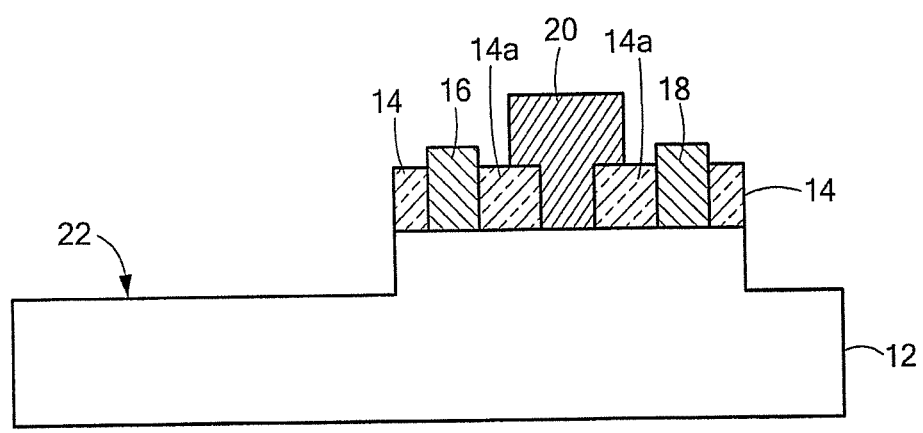

Next, as shown in FIGS. 2 and 3, source, drain and gate contacts 16, 18 and 20 are etched through openings in the dielectric layer 14 using conventional photolithographic-etching techniques. More particularly, ohmic source and drain contacts 16, 18 are formed to the GaN layer and a gate electrode 20 is formed, as shown, using conventional techniques. It is noted that portions 14a of the dielectric passivation layer 14 remain disposed between the gate contact 20 and a drain contact 18 of the device and between the gate contact 20 and the source contact 16 of the device.

Figure 4:
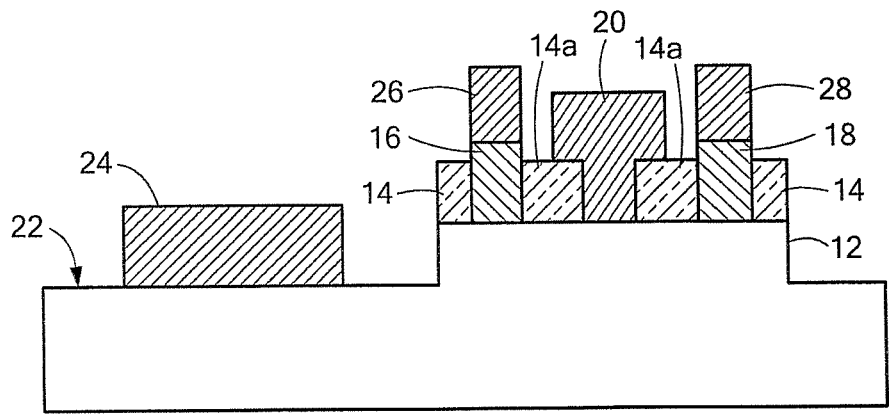

Next, in the capacitor region 22 on the substrate, a conductive layer is deposited over the structure and patterned using conventional techniques to form a lower electrode 24 for a capacitor and upper contacts 26, 28 for the source and drain contacts 16, 18 as shown in FIG. 4.

Figure 5:
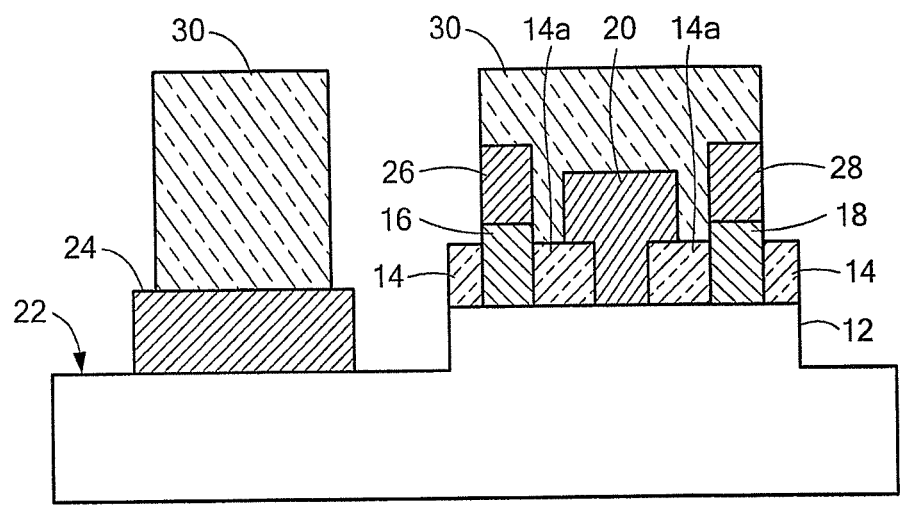

Next, a second dielectric layer 30, herein also referred to as an upper dielectric layer, of the same material as dielectric layer 14, here SiN, is deposited as a continuous upper dielectric layer extending over the entire surface of the structure including over the lower electrode 24 of the capacitor and on the dielectric layer 14 including the portions 14a of the dielectric layer 14 disposed between the gate contact 20 and the drain 18 and between the gate contact 20 and the source contact 16 as well as over the gate contact 20 itself, as shown in FIG. 5, the upper dielectric layer 30 being formed thicker than the lower dielectric layer 14 using a second deposition process, here for example PECVD. The thickness of the upper dielectric layer 30 is in the range of 100-300 nm and the thickness of the first dielectric layer 14 is in the range of 10-100 nm.

It is to be noted that in non-MBE SiN films such as PECVD films (ex situ) there is a higher hydrogen ($H_2$) content (~10%) and the hydrogen is actually bonded to the silicon and nitrogen. The material is sometimes considered SiNH. Hydrogen can be detected in the SiN films of the finished product. The capacitor dielectric SiN, i.e., the second dielectric layer, is, as noted above, will have a detectable higher hydrogen content than passivation SiN first dielectric layer fabricated by, here for example, in the in situ MBE embodiment or the ex situ MOCVD/MBE embodiment. In the case of PECVD SiN, the atomic concentration of hydrogen films is approximately 10% (10% of the atoms are hydrogen) compared to less than 0.1% in MBE SiN. Therefore, the MBE deposition process provides the first dielectric layer with a substantially lower etch rate to buffered hydrofluoric acid (BHF) wet etch chemistry than the etch rate of BHF wet etch chemistry to the PECVD deposited second SiN dielectric layer. The etch selectivity between PECVD SiN and, here for example, MBE SiN is as high as 14 (=0.38/0.03)–16(=0.49/0.03) to 1.

Next, the portion of the upper dielectric layer 30 on the lower electrode 24 of the capacitor is masked while exposing a portion of the upper dielectric layer 30 on the lower dielectric layer 14 including the portions 14a between the gate contact 20 and the drain contact 18 and between the gate contact 20 and the source contact 16.

Figure 6:
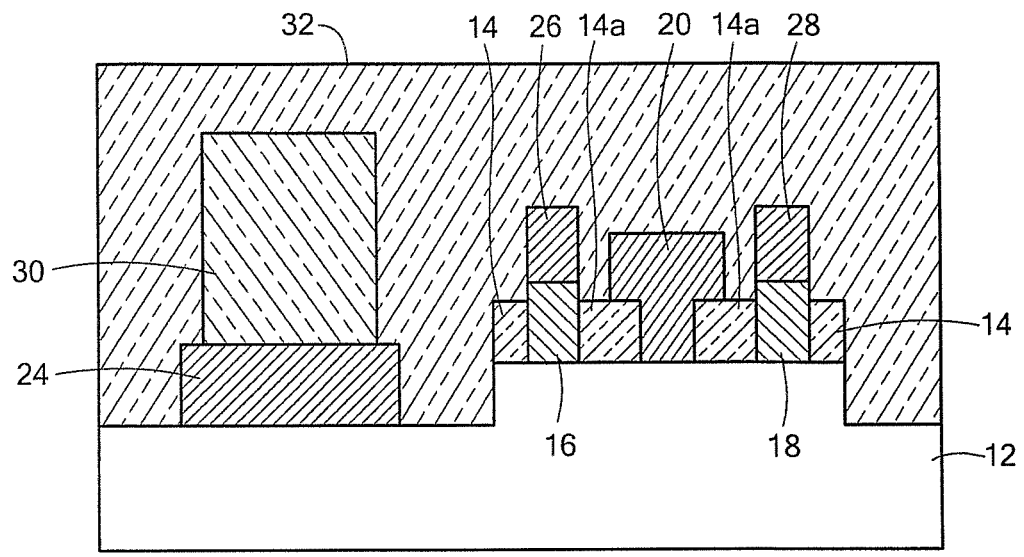

Next, the unmasked structure is exposed to a BHF wet etch chemistry to selectively remove the exposed portions of the upper dielectric layer 30 on the lower dielectric layer 14 including the portions 14a between the gate contact 20 and the drain contact 18 and between the gate contact 20 and the source contact 16 while leaving unetched the masked portion of the upper dielectric layer 30 on the lower electrode of the capacitor, as shown in FIG. 6.

It is noted that the selectivity in the etching of the exposed portions of the upper SiN dielectric layer 30 and the lower SiN dielectric layer 14. More particularly, the etching of the exposed portions of the upper SiN layer 30 is self limiting because of the different etch rates of the upper SiN layer 30 and the lower SiN layer 14. Thus, while both the upper dielectric layer 30 and lower dielectric layer 14 are of the same dielectric material, here SiN, the lower SiN dielectric layer 14 is deposited by MBE on ex-situ MOCVD material or in-situ MBE material during the GaN transistor epitaxy growth process while the upper SiN dielectric layer 30 is formed ex-situ using PECVD for example. This layer 14, which hereby is referred to as Pass-SiN, is deposited at the growth temperature of 500-700° C. and has among a host of favorable attributes, a dramatically slower etch rate (by a factor of 14-16 in the case of PECVD SiN) compared to alternate deposited SiN dielectric layer 30 used for the capacitor SiN. This 14-16:1 etch rate ratio provides the selectivity needed for wet etch chemistry processes to effectively remove the capacitor SiN dielectric layer 30 and leave the in-situ SiN lower dielectric layer 14 intact or unaltered. Wet etch chemistries as opposed to plasma-based dry etch chemistries provides a gentler approach to completely remove the exposed capacitor SiN dielectric layer 30 in key areas surrounded by metal structures, such as the source, drain and gate contacts of varying topologies (e.g. mushroom gates and source/drain ohmic contacts) with minimal or no damage to them. In addition, because the pass-SiN layer 14 is part of the GaN transistor epitaxy process, its thickness can be controlled reproducibly at the sub-nm scale which allows for thinner pinhole-free films much less than 50-nm to be realized. This in turn should further minimize RF loading while still maintaining true passivation of the device.

An additional benefit the pass-SiN layer 14 brings because of its high density, pinhole-free quality in ultra-thin layers is the ability to realize ultra-low leakage, high quality metal-insulator-semiconductor field effect transistors (MISFETs) where the gate metal can sit directly on top of an ultra-thin in-situ dielectric layer 14 rather than through it. Adjusting the underlying Schottky AlGaN thickness to accommodate the additional ultra-thin pass-SiN layers for such devices provides another degree of flexibility and design towards greatly improving linearity performance without sacrificing transconductance and gain performance. This could be further extended for ultra-high frequency and gain performance at millimeter-wave frequencies, where MISFETs or HEMTs based on high Al-containing (>25%) ultra-thin AlGaN or AlN Schottky layers on GaN can be realized without the potential concern of carrier loss due to surface trapping/depletion or leakage along the semiconductor surface.

A final benefit is noted of the pass-SiN layer 14 when it is deposited in the MBE machine after MBE growth of the semiconductor, a process known as in situ deposition. With in situ deposition, the critical interface between the semiconductor and pass-SiN is never exposed to contaminating air, which occurs with the alternate pass-SiN process. The in situ process eliminates the high concentration of surface contaminants such as oxygen, carbon, and silicon at the semiconductor-pass-SiN interface.

Figure 7:
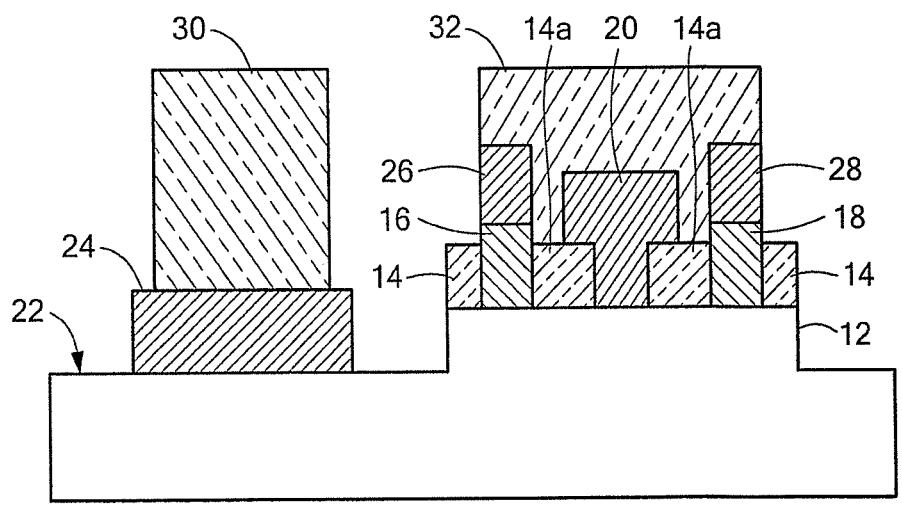

Next, a low-k dielectric layer 32, here for example, $SiO_2$, is deposited over the surface of the structure, here using atomic layer deposition (ALD) or PECVD, as shown in FIG. 6. Next, portions of the low-k dielectric layer 32 are selectively removed using conventional photolithograph-etching processes to form the structure shown in FIG. 7.

Figure 8:
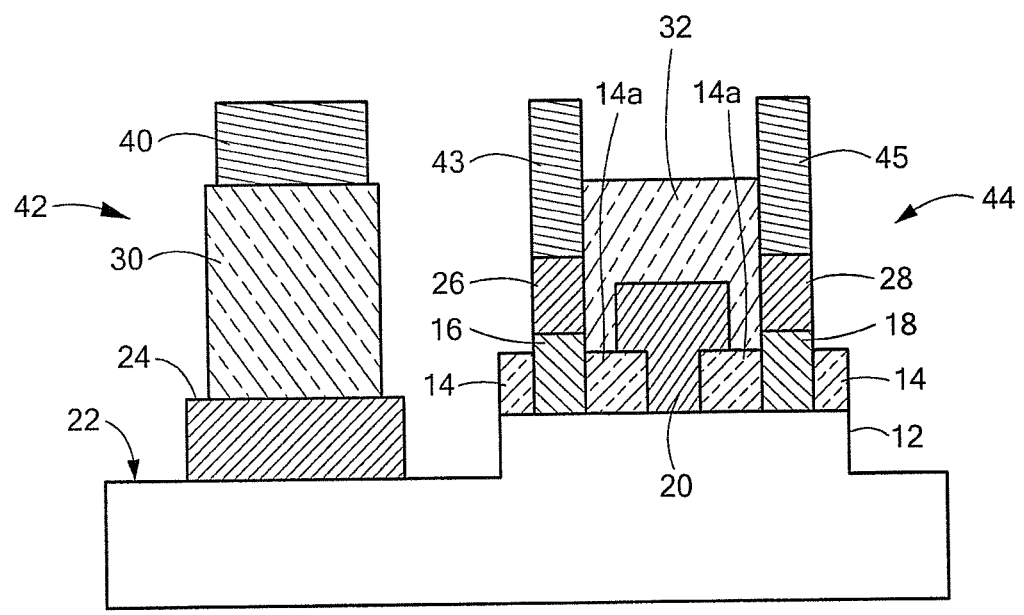

Next, portions of layer 32 are removed above the source and drain contacts 26, 28 using conventional photolithograph-etching processes. Next, an upper conductor is deposited over the structure and patterned to form an upper electrode 40 for the capacitor 42 on the unetched portion of the upper dielectric layer 30 and upper contacts 43, 45 for the source and drain contacts 16, 26 and 18, 28, respectively for transistor device 44, as indicated in FIG. 8.

Thus, the method selectively removes the capacitor SiN dielectric layer 30 between source and drain of the transistor during device fabrication and replaces it with an alternate low-k dielectric film without compromising the voltage capability of the MIM capacitor 42 while still maintaining good passivation and high frequency performance of the HEMT 44. For MISFETs the process flow is as described above with the etching through the lower dielectric layer 14 for the gate contact 20 step shown in FIG. 3 skipped.

A number of embodiments of the disclosure have been described. Nevertheless, it will be understood that various modifications may be made without departing from the spirit and scope of the disclosure. For example, while the use of two different dielectric layers having different hydrogen content has been used as described above to form a structure with a capacitor and a transistor, the use of two different dielectric layers having different hydrogen contents may be used for other structures. Further, while two different processes were used to form the SiN dielectric layers, (a MBE (or MBE/MOCVD) for the first process and non-MBE for the second process), the same process may be used to form the SiN dielectric layers with two different hydrogen concentrations such as forming the first SiN layer using a MBE with almost no hydrogen content, and later the SiN is grown with hydrogen added to the growth process. Accordingly, other embodiments are within the scope of the following claims.

What is claimed is:

1. A structure comprising:
   a semiconductor;
   a capacitor disposed on one surface portion of the semiconductor;
   a transistor device disposed on a second surface portion of the semiconductor;
   wherein the capacitor comprising:
      a capacitor dielectric, and
      a pair of capacitor electrodes separated by the capacitor dielectric;
         wherein the transistor device has three electrodes;
      wherein a first one of the transistor device electrodes is separated from a second one of the transistor device electrodes by a first portion of a device dielectric and the second one of the transistor device electrodes is separated from a third one of the transistor device electrodes by a second portion of the device dielectric;
      wherein the first portion of the device dielectric and the second portion of the device dielectric are in direct contact with the semiconductor;
      wherein the capacitor dielectric and the device dielectric are the same material and have different thicknesses; and wherein the capacitor dielectric and the device dielectric have different hydrogen contents; and wherein an etch rate of the capacitor dielectric is at least fourteen to one greater than an etch rate of the device dielectric to the same etchant.

2. The structure recited in claim 1 wherein the device dielectric and the capacitor dielectric are silicon nitride.

3. The structure recited in claim 1 wherein the first and third transistor device electrodes are source and drain electrodes and the second transistor device electrode is a gate electrode.

4. The structure recited in claim 3 wherein the device dielectric and the capacitor dielectric are silicon nitride.

5. A structure comprising:
a semiconductor;
a capacitor disposed on one surface portion of the semiconductor;
a transistor device disposed on a second surface portion of the semiconductor;
wherein the capacitor comprising:
  a capacitor dielectric, and
  a pair of capacitor electrodes separated by the capacitor dielectric;
    wherein the transistor device has three electrodes;

wherein a first one of the transistor device electrodes is separated from a second one of the transistor device electrodes by a first portion of a device dielectric and the second one of the transistor device electrodes is separated from a third one of the transistor device electrodes by a second portion of the device dielectric;

wherein the first portion of the device dielectric and the second portion of the device dielectric are in direct contact with the semiconductor;

wherein the capacitor dielectric and the device dielectric are the same material and have different thicknesses; and wherein a hydrogen concentration of the capacitor dielectric is at least one hundred to one greater than a hydrogen concentration of the device dielectric.

6. The structure recited in claim 5 wherein an etch rate of the capacitor dielectric is at least fourteen to one greater than an etch rate of the device dielectric to the same etchant.

7. The structure recited in claim 1 wherein the etchant is buffered hydrofluoric acid (BHF).

8. The structure recited in claim 6 wherein the etchant is buffered hydrofluoric acid (BHF).

* * * * *